(12) United States Patent
Hannuki et al.

(10) Patent No.: US 8,053,830 B2
(45) Date of Patent: Nov. 8, 2011

(54) SEMICONDUCTOR DEVICE

(75) Inventors: Keiji Hannuki, Niiza (JP); Shuichi Kaneko, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 246 days.

(21) Appl. No.: 12/169,207

(22) Filed: Jul. 8, 2008

(65) Prior Publication Data
US 2009/0079085 A1    Mar. 26, 2009

(30) Foreign Application Priority Data
Sep. 26, 2007   (JP) ................ 2007-249526

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/328; 257/329; 257/E29.118
(58) Field of Classification Search .......... 257/328, 257/329, E29.118
See application file for complete search history.

(56) References Cited

U.S. PATENT DOCUMENTS
5,438,212 A * 8/1995 Okaniwa ............... 257/275
2007/0176207 A1 * 8/2007 Kurokawa et al. ........ 257/198

FOREIGN PATENT DOCUMENTS
| JP | 1-183166 | 7/1989 |
| JP | 6-310547 | 4/1994 |
| JP | 10-321877 | 12/1998 |
| JP | 11-163205 | 6/1999 |
| JP | 2000-40825 | 2/2000 |
| JP | 2001-44219 | 2/2001 |
| JP | 3791459 | 4/2006 |

OTHER PUBLICATIONS

Office Action issued on Aug. 16. 2011 in the counterpart Japanese Patent Application Serial No. 2007-249526 (with English Translation).

* cited by examiner

*Primary Examiner* — Thien F Tran
(74) *Attorney, Agent, or Firm* — Oblon, Spivak, McClelland, Maier & Neustadt, L.L.P.

(57) ABSTRACT

A semiconductor device including a semiconductor section including a semiconductor element and a recess formed in one of main surfaces and a metallic member at least a part of which is embedded in the recess. A void is formed in a region of the metallic member corresponding to the recess.

4 Claims, 4 Drawing Sheets

SEMICONDUCTOR DEVICE

BACKGROUND OF THE INVENTION

1. Field of the Invention

The present invention relates to a semiconductor device including a metallic member a part of which is embedded in a recess formed in a substrate.

2. Description of the Related Art

A semiconductor device including a substrate in which a semiconductor element and a recess are formed and a metallic member embedded in the recess for release of heat has been hitherto known.

Japanese Patent Publication No. 3791459 (hereinafter, Patent Literature 1) discloses a semiconductor device including a semiconductor layer provided with a semiconductor element formed therein, a support substrate formed a plurality of recesses for supporting the semiconductor layer and a metallic member embedded in the recess of the support substrate. The metallic member is made of a material with high thermal conductivity such as copper, aluminum, silver, gold, copper alloy, aluminum alloy, silver alloy, and gold alloy to quickly release heat generated in upper part of the semiconductor element during operation of the semiconductor element.

However, the linear expansion coefficients of copper and aluminum are $17\times10^{-6}/°$ C. and $23\times10^{-6}/°$ C., respectively while the linear expansion coefficient of the support substrate, for example, a silicon substrate is $3\times10^{-6}/°$ C. In the semiconductor device of the aforementioned Patent Literature 1, the metallic member and support substrate are different in linear expansion coefficient. Accordingly, stress due to the difference in linear expansion coefficient affects the support substrate. Furthermore, part of the support substrate where the recess is formed to embed the metallic member therein is thinner than part of the substrate where the recess is not formed. Accordingly, the support substrate warps and deforms.

SUMMARY OF THE INVENTION

The present invention was invented to solve the aforementioned problem, and an object of the present invention is to provide a semiconductor device capable of preventing itself from changing in electrical characteristics because of deformation of the support substrate due to heat generated during the operation of the semiconductor element and conducted to the support substrate.

A first invention is a semiconductor device including a semiconductor section including a semiconductor element and a recess formed in one of main surfaces and a metallic member at least a part of which is embedded in the recess. A void is formed in a region of the metallic member corresponding to the recess.

According to the first invention, by providing the void in the metallic member, it is possible to prevent deformation of the substrate due to stress caused by a difference in linear expansion coefficient between the substrate and metallic member with the heat release properties thereof maintained or prevented from degrading.

In a second invention, a plurality of the recesses are formed in the one of the main surfaces. Intervals between the recesses in side part of the semiconductor section are narrower than intervals between the recesses in center part of the same.

In a third invention, a plurality of the voids are formed in each of the recess. An electrode section is formed in the other main surface of the semiconductor section. The metallic member is in a low-resistance contact with bottom and side surfaces of the recess, and the metallic member is formed on the other main surface where a recess is not formed.

DETAILED DESCRIPTION OF THE INVENTION

First Embodiment

Figure 1:
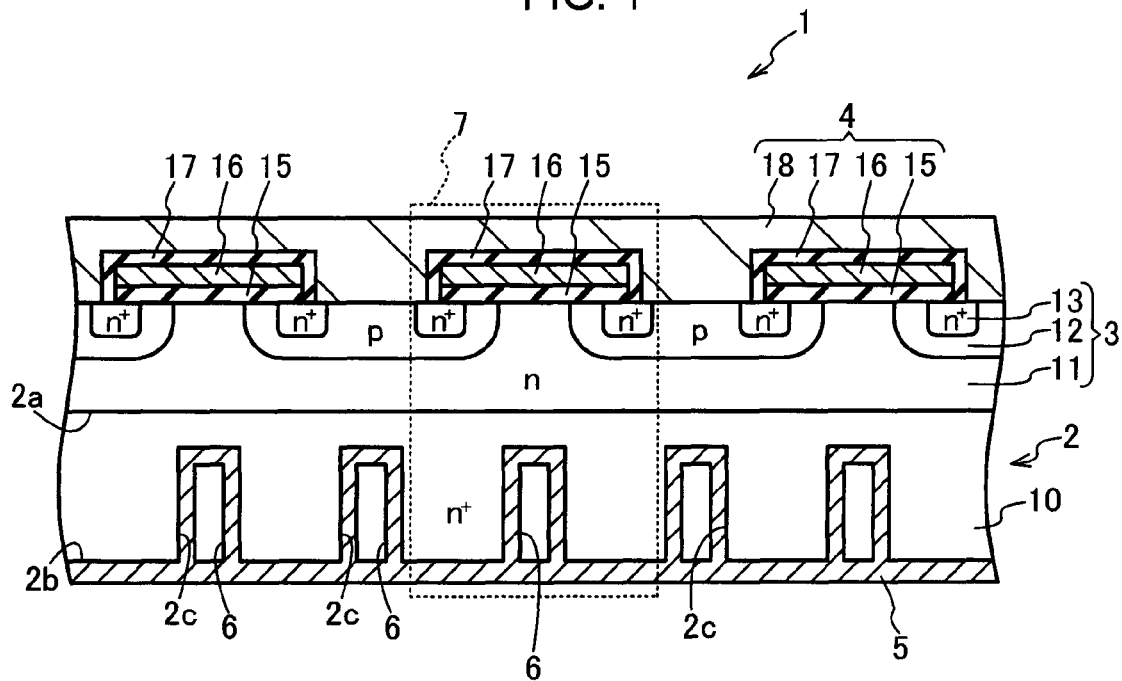
FIG. 1 is a partial cross-sectional view of a semiconductor device according to a first embodiment.

Hereinafter, with reference to the drawings, a description is given of a semiconductor device according to a first embodiment in which the present invention is applied to a vertical MOSFET. FIG. 1 is a partial cross-sectional view of a semiconductor device according to the first embodiment.

As shown in FIG. 1, a semiconductor device 1 includes a semiconductor section having a substrate 2 and a semiconductor element region 3, electrode sections 4, and a drain electrode 5 (equivalent to metallic members of claims). A region 7 surrounded by a dotted line in FIG. 1 indicates a single unit of the MOSFETs 7 (equivalent to a semiconductor element of claims).

The substrate 2 is composed of $n^+$ type silicon with a thickness of several hundreds μm and includes a drain region 10. In a first main surface 2a of the substrate 2, the semiconductor element region 3 is formed. In a second main surface 2b (equivalent to one of main surfaces of claims) of the substrate 2, a plurality of recesses 2c are formed so as to extend in a thickness direction and have a width of 1 to 10 μm, for example, about 5 μm, and a depth of 10 to 300 μm, for example, about 100 μm. The recesses 2c are arranged at intervals of about 5 μm. It is desirable that the aspect ratio (depth/width) of each recess 2c for easy formation of later described voids 6 in the recesses 2 is large.

The semiconductor element region 3 includes a drift region 11, base regions 12, and source regions 13.

The drift regions 11 are composed of n-type silicon. The drift region 11 has a concentration of impurities lower than that of the drain region 10. The drift region 11 is formed so as to cover the first main surface 2a of the substrate 2. The base regions 12 form channels between the drift region 11 and the source region 13. The base regions 12 are composed of p-type silicon. The base regions 12 are formed at predetermined regions in a surface of the drift regions 11 on the electrode section 4 side. The base regions 12 are formed into rectangles larger than the source regions 13 and surround the respective source region 13 in a plan view. The source regions 13 are composed of $n^+$ type silicon. The source regions 13 have a concentration of impurities higher than that of the drift region 11. The source region 13 is formed into a square ring in the base region 12.

The electrode sections 4 includes a gate insulating film 15, a gate electrode 16, an interlayer insulating film 17, and a source electrode 18 in an upper surface (equivalent to the other main surface of claims) of the semiconductor element region 3.

The gate insulating film 15 is composed of a silicon oxide film and is formed between the semiconductor element region 3 and gate electrode 16. The gate electrode 16 forms a channel in the base region 12 sandwiched between the drift region 11 and source region 13. The gate electrode 16 is composed of polysilicon and is formed on the gate insulating film 15. The gate electrode 16 is formed in a lattice in a plan view and is connected to a metallic gate terminal (not shown). The interlayer insulating film 17 insulates the gate electrode 16 from the source electrode 18. The interlayer insulating film 17 is composed of a silicon oxide film. The source electrodes 18 is electrically connected to the base regions 12 and source regions 13. The source electrode 18 is composed of an aluminum film.

The drain electrode 5 is composed of a film stack of titanium and nickel or an aluminum film. The drain electrode 5 is formed in a low resistance contact to a first part of the second main surface 2b of the substrate 2 where the recesses 2c are not formed. Desirably, the drain electrode 5 is formed so as to cover the first part of the second main surface 2b of the substrate 2 in order to reduce contact resistance with the substrate 2. Moreover, the drain electrode 5 is embedded in recesses 2c and is formed in a low resistance contact to second parts of the second main surface 2b of the substrate 2 where the recesses 2c are formed, or side and bottom surfaces of the recesses 2c. The drain electrode 5 does not fill the entire area of each recess 2c, and each recess 2c includes a void 6 formed therein.

Next, a description is given of an operation of the aforementioned semiconductor device 1.

When a predetermined voltage is applied to the gate electrode 16, channels are formed between the drift region 11 and source regions 13 in areas of the base regions 12 on the gate electrode 16 side. In this state, when a voltage is applied between the source electrode 18 and the drain electrode 5, current flows from the source electrodes 18 through the source regions 13, the channels of the base regions 12, the drift region 11, and the drain region 10 to the drain electrode 5.

Figure 2:
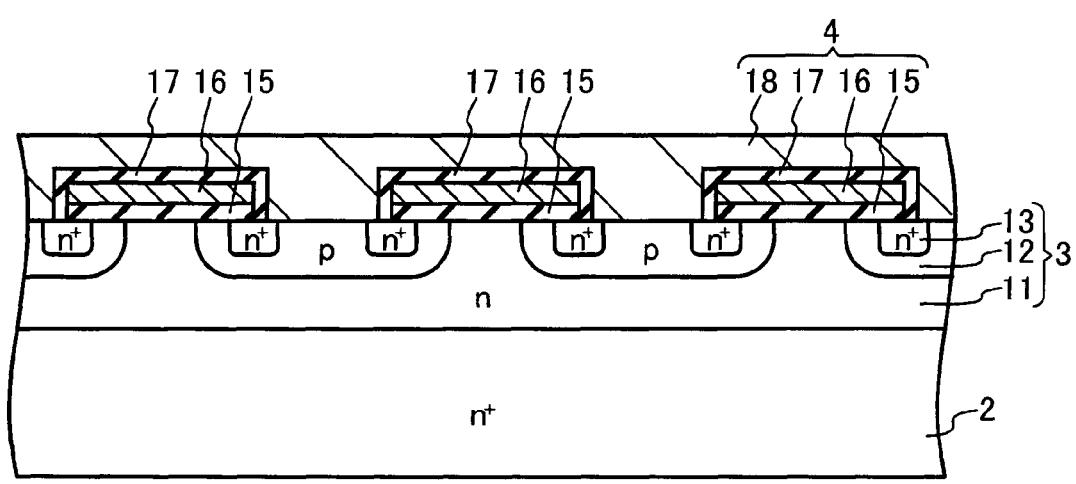
FIG. 2 is a partial cross-sectional view at a manufacturing step.
Figure 3:
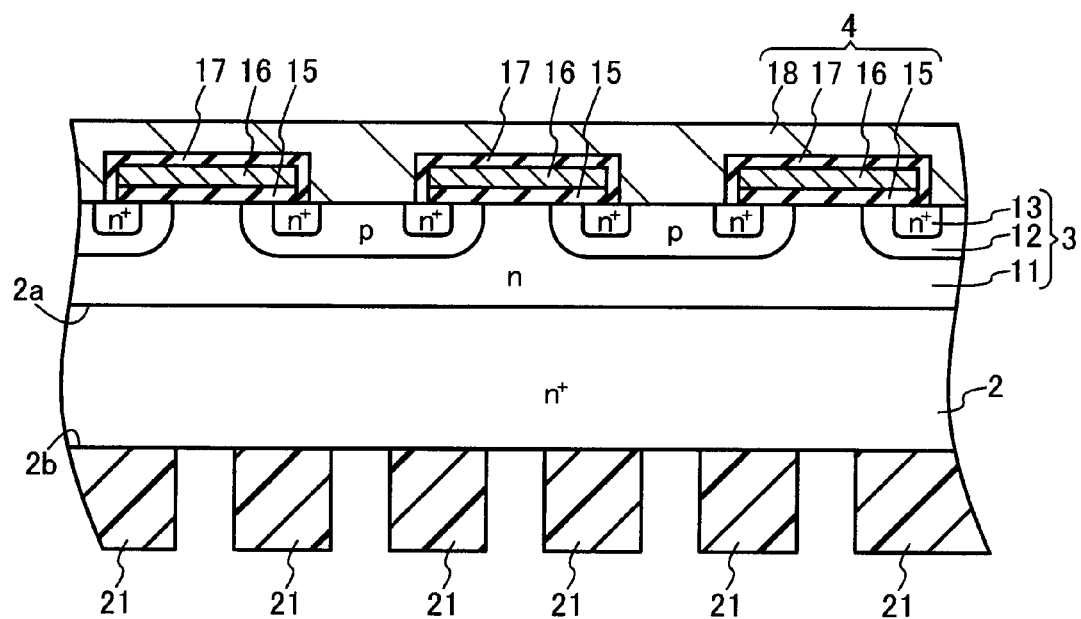
FIG. 3 is a partial cross-sectional view at a manufacturing step.
Figure 4:
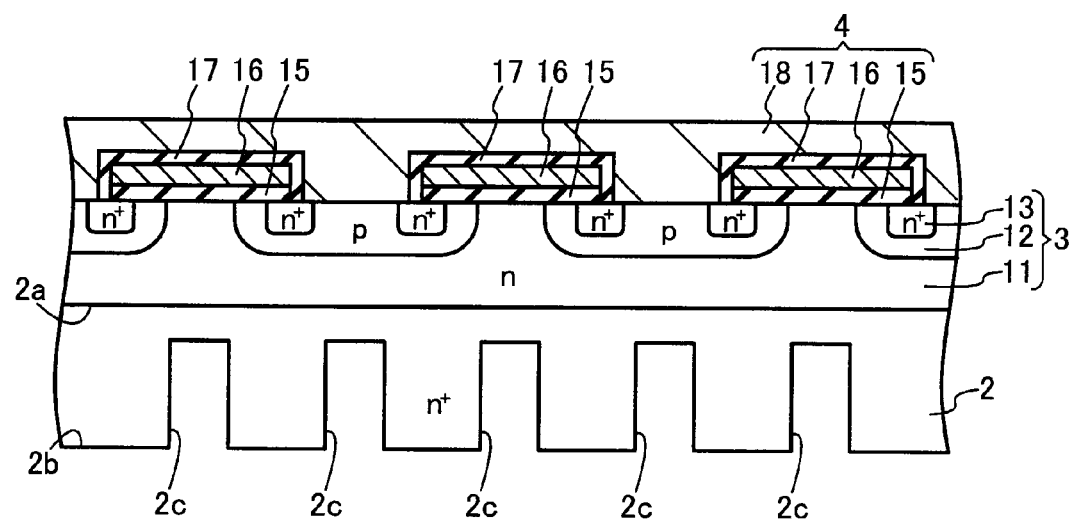
FIG. 4 is a partial cross-sectional view at a manufacturing step.

Next, a description is given of a method of manufacturing the above semiconductor device 1 with reference to the drawings. FIGS. 2 to 4 are partial cross-sectional views of individual manufacturing steps.

First, as shown in FIG. 2, the substrate 2 composed of $n^+$ type silicon is prepared. Next, an n-type silicon layer is epitaxially grown on the first main surface 2a of the substrate 2. Thereafter, the semiconductor element region 3 and electrode section 4 are formed by using a known ion injection method, etching technique, photolithography technique, and the like.

Next, as shown in FIG. 3, a resist film 21 with a desired pattern is formed on the second main surface 2b of the substrate 2 by a photolithography technique so as to expose part of the substrate 2 other than regions where the recesses 2c are formed.

Next, as shown in FIG. 4, the recesses 2c are formed in the second main surface 2b of the substrate 2 by RIE (reactive ion etching). The resist film 21 is then removed.

Eventually, as shown in FIG. 1, the drain electrode 5 including the voids 6 formed in the individual recesses 2c are composed of an aluminum film by vacuum deposition. In the step of forming the drain electrode 5, the higher the aspect ratio of the recesses 2c is, the voids 6 can be more easily formed when the aluminum film is formed by the vacuum deposition or the like. The semiconductor device 1 is thus completed.

As described above, in the semiconductor device 1 according to the first embodiment, the voids 6 are formed in the drain electrode 5. Herein, if the semiconductor device 1 becomes hot, the difference in linear expansion coefficient between the substrate 2 which is made of a semiconductor and the drain electrode 5 which is made of metal, causes a stress. However, the metal of the drain electrode 5 is more elastic than the substrate 2, and deformation of the voids 6 or the like can relax the stress. Accordingly, the deformation due to warp and the like of the semiconductor device 1 can be prevented. It is therefore possible to reduce variations in characteristic of the semiconductor device 1.

Moreover, the substrate 2 is thick in the first part of the second main surface 2b, and the semiconductor device 1 is mechanically strong. Furthermore, the drain electrode 5 and the second part of the main surface 2b of the substrate 2, where the recesses 2c are formed, are in low-resistance contact with each other, thus reducing on-resistance thereof. Still furthermore, the drain electrode 5 has a higher thermal conductivity than that of the substrate 2, and accordingly, heat generated by the semiconductor elements can be easily radiated through the drain electrode 5.

Second Embodiment

Figure 5:
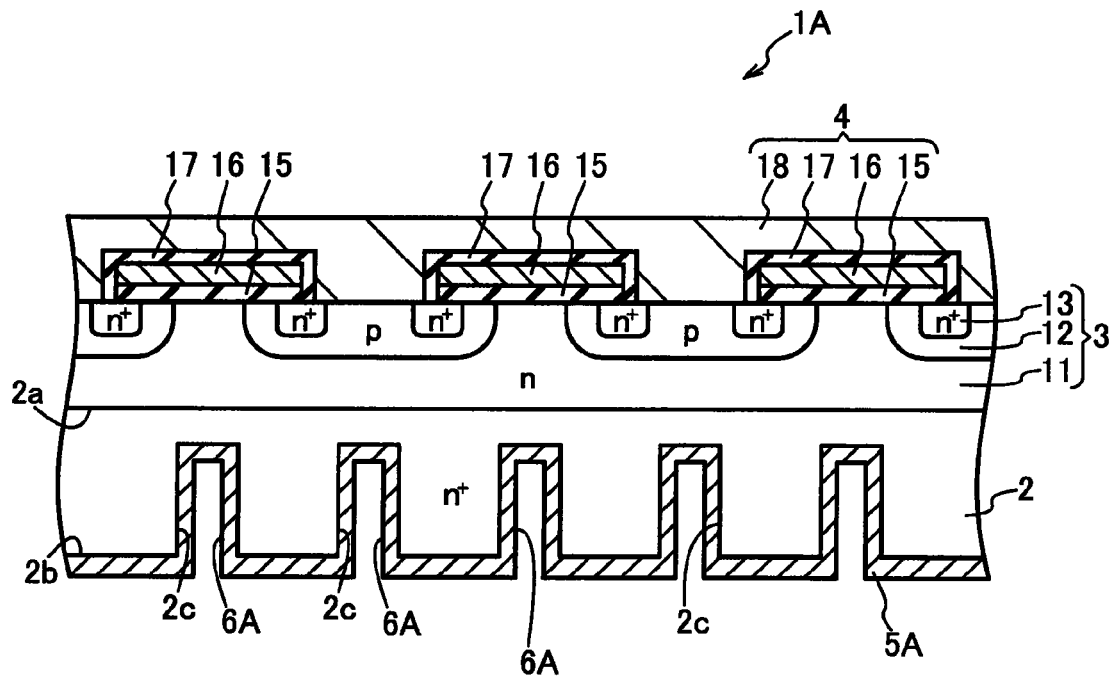
FIG. 5 is a partial cross-sectional view of a semiconductor device according to a second embodiment.

Next, a description is given of a second embodiment obtained by modifying a part of the aforementioned first embodiment with reference to the drawing. FIG. 5 is a partial cross-sectional view of a semiconductor device according to the second embodiment. The same components as those of the first embodiment are given same reference numerals, and the description thereof is omitted.

As shown in FIG. 5, in a semiconductor device 1A according to the second embodiment, voids 6A are formed in a drain electrode 5A. An end of each of the voids 6A in the thickness direction is opened.

As described above, the semiconductor device 1A according to the second embodiment is provided with the voids 6A in the drain electrode 5A and can therefore provide a similar effect to the first embodiment.

Third Embodiment

Figure 6:
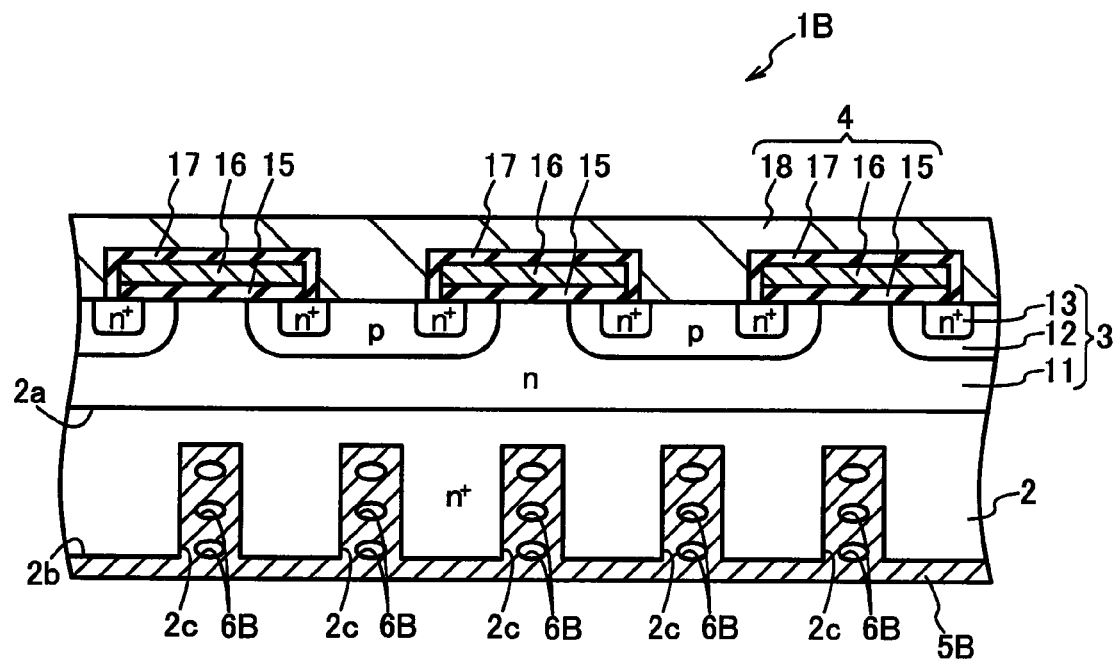
FIG. 6 is a partial cross-sectional view of a semiconductor device according to a third embodiment.

Next, with reference to the drawing, a description is given of a third embodiment obtained by modifying a part of the aforementioned first embodiment. FIG. 6 is a partial cross-sectional view of a semiconductor device according to the third embodiment. The components same as those of the first embodiment are given same reference numerals, and a description thereof is omitted.

As shown in FIG. 6, in a semiconductor device 1B according to the third embodiment, a plurality of voids 6B are formed in a region of the drain electrode 5B corresponding to each of the recesses 2c. The voids 6B have the same size and shape. The voids 6B are cyclically arranged. The voids 6B may have different sizes or shapes. Moreover, the voids 6B may be not cyclically arranged.

As described above, the semiconductor device 1B according to the third embodiment is provided with the drain electrode 5B and the plurality of voids 6B formed in each recess 2c and can therefore provide a similar effect to that of the first embodiment. Furthermore, a lot of the voids 6B are formed in the region corresponding to each recess 2C, and the stress can be therefore further reduced.

Fourth Embodiment

Figure 7:
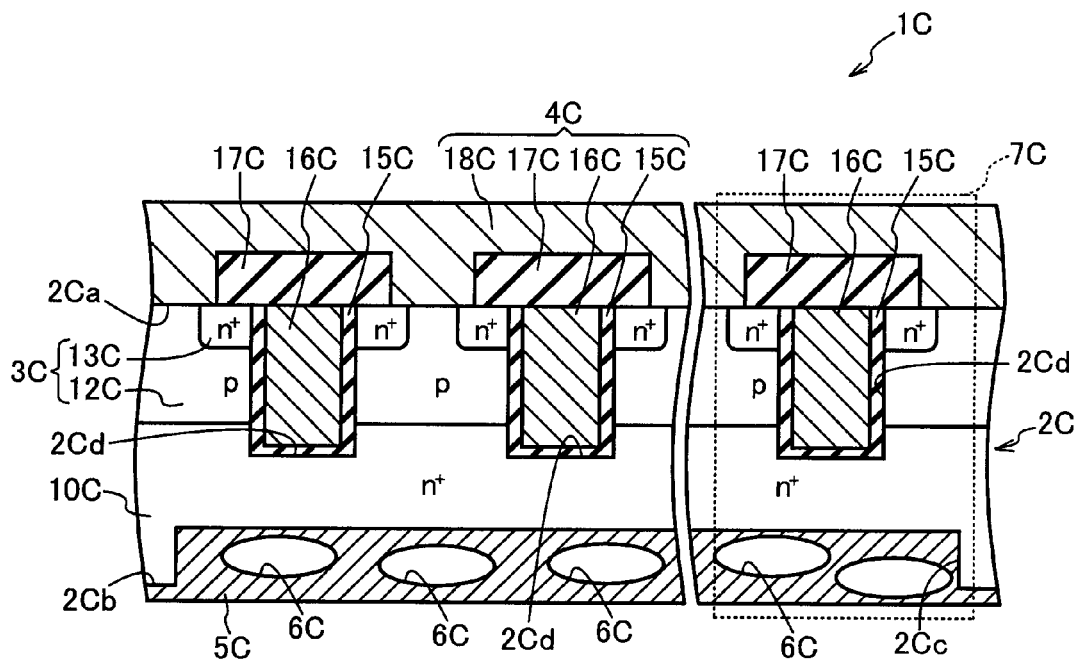
FIG. 7 is a partial cross-sectional view of a semiconductor device according to a fourth embodiment.

Next, a description is given of a fourth embodiment obtained by applying the present invention to a MOSFET having a trench gate structure with reference to the drawing. FIG. 7 is a partial cross-sectional view of a semiconductor device according to the fourth embodiment. The components same as those of the first embodiment are given same reference numerals, and a description thereof is omitted.

As shown in FIG. 7, a semiconductor device 1C according to the fourth embodiment includes a substrate 2C, electrode sections 4C, and a drain electrode 5C.

In the substrate 2C, a drain region 10C, a base region 12C, and source regions 13C are formed. In a first main surface 2Ca of the substrate 2C, recesses 2Cd are formed so as to extend to the center. Each of recesses 2Cc is formed corresponding to eight to ten of the recesses 2Cd, or eight to ten MOSFETs 7C.

The drain region 10C is formed in the second main surface 2Cb side of the substrate 2C and is composed of $n^+$ type silicon. The base region 12C is formed in the first main surface 2Ca side of the substrate 2C and is composed of p-type silicon. The source region 13C is formed in the first main surface 2Ca side of the substrate 2C so as to be surrounded by the base region 12C. The source region 13C is composed of n-type silicon.

Each of the electrode sections 4C includes a gate insulating film 15C, a gate electrode 16C, an interlayer insulating film 17C, and a part of a source electrode 18C.

The gate insulating film 15C is composed of a silicon oxide film and is formed on an inner wall surface of the corresponding recess 2C. The gate electrode 16C is composed of conductive polysilicon and is embedded within the gate insulating film 15C.

The interlayer insulating film 17C is composed of a silicon oxide film and is formed so as to cover upper part of the gate insulating film 15C and gate electrode 16C. The source electrode 18C is composed of an aluminum film and is formed so as to cover upper surfaces of the substrate 2C and interlayer insulating film 17C.

The drain electrode 5C is composed of an aluminum film. The drain electrode 5C is formed so as to cover the second main surface 2Cb of the substrate 2. Part of the drain electrode 5C is embedded in the recesses 2Cc. In a region corresponding to each recess 2Cc section of the drain electrode 5C, a plurality of voids 6C are formed.

As described above, the semiconductor device 1C according to the fourth embodiment is provided with the voids 6C formed in the drain electrode 5C and can therefore provide a similar effect to that of the first embodiment.

Fifth Embodiment

Figure 8:
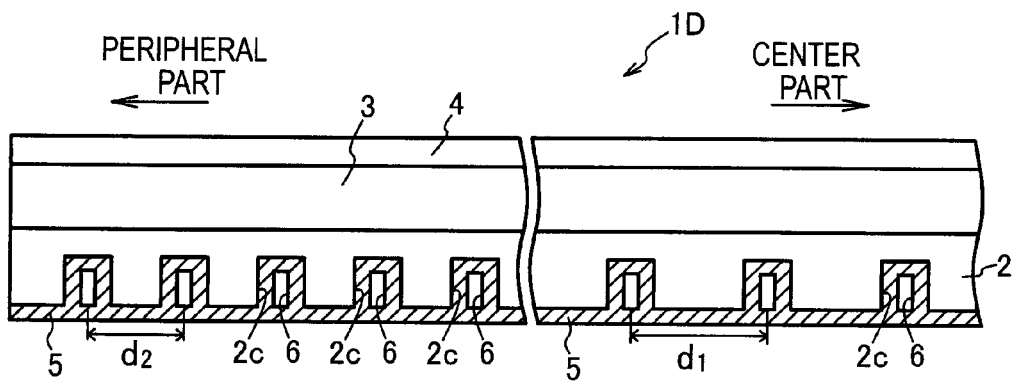
FIG. 8 is a partial cross-sectional view of a semiconductor device according to a fifth embodiment.

Next, a description is given of a fifth embodiment obtained by modifying a part of the aforementioned first embodiment with reference to the drawing. FIG. 8 is a partial cross-sectional view of a semiconductor device according to the fifth embodiment. The components same as those of the first embodiment are given same reference numerals, and a description thereof is omitted.

As shown in FIG. 8, in a semiconductor device 1D of the fifth embodiment, intervals between the recesses 2c are not equal. Herein, intervals of the recess sections 2c formed in the center part of the semiconductor device 1D are $d_1$, and intervals of the recess sections 2c formed in the peripheral part of the semiconductor device 1D is $d_2$.

In the semiconductor device 1D, the interval $d_2$ of the peripheral part, which largely warps and deforms, is set smaller than the interval $d_1$ of the center part, which deforms less. Furthermore, in a same region, the number of recesses 2c in the peripheral part may be set larger than that in the central part, and the number of voids 6 formed in the drain electrode 5 in the peripheral part may be also set larger than that in the central part.

As described above, the semiconductor device 1D according to the fifth embodiment, the recesses 2c are formed more in the peripheral part, which is largely deformed, than in the center part to provide more voids 6 in the peripheral part. It is therefore possible to prevent deformation of the peripheral part and accordingly further prevent deformation of the entire semiconductor device 1D.

Hereinabove, the present invention is described in detail using the embodiments, but the present invention is not limited to the embodiments described in the specification. The scope of the present invention is determined by the description of claims and equivalents thereof. Hereinbelow, a description is given of modifications obtained by partially modifying the above embodiments.

For example, the aforementioned embodiments include the example of the present invention applied to a vertical MOSFET. In addition, the present invention may be also applied to other semiconductor devices such as horizontal MOSFETs and IGBTs.

Moreover, the aforementioned embodiments include the example including the drain electrode with the voids formed therein. The voids may be formed not in the drain electrode but in a heat releasing metallic member formed in the rear surface.

In the aforementioned embodiments, the drain electrode is formed by vacuum deposition but may be formed by spattering, plating, or the like.

In the aforementioned embodiments, the voids are not filled with any material but may be filled with a material softer than the metallic member constituting the drain electrode.

Moreover, the specific numerals in the aforementioned embodiments can be properly changed. For example, the thickness of the substrate, the depth and intervals of the recesses, and the like can be properly changed. Specifically, it may be configured that, in a plan view, only a single large recess is formed in any one of the main surfaces of the substrate and voids are formed in a metallic member provided therein.

What is claimed is:

1. A semiconductor device, comprising:
   a semiconductor section including a semiconductor element and a recess formed in one of main surfaces;
   an electrode formed in the other main surface; and
   a metallic member, at least a part of which is embedded in the recess, wherein a void is formed in a region of the metallic member corresponding to the recess, and a part of the semiconductor section is formed between a bottom of the recess and the electrode.

2. The device of claim 1, wherein a plurality of recesses are formed in the one of the main surfaces, and intervals between the recesses in a side part of the semiconductor section are narrower than intervals between the recesses in a center part of the semiconductor section.

3. The device of claim 1, wherein a plurality of voids are formed in the recess, an electrode section is formed in the other main surface of the semiconductor section, the metallic member is in low-resistance contact with bottom and side surfaces of the recess, and the metallic member is formed on the other main surface where a recess is not formed.

4. The device of claim 1, wherein the semiconductor element is formed between the bottom of the recess and the electrode.

* * * * *